US012742839B2

(12) United States Patent
Ameloot et al.

(10) Patent No.: US 12,742,839 B2
(45) Date of Patent: Sep. 22, 2026

(54) 3D PRINTED MRI COIL, PHANTOM AND SHIMMING ELEMENT

(71) Applicant: Katholieke Universiteit Leuven, Leuven (BE)

(72) Inventors: Rob Ameloot, Leuven (BE); Hanne Vanduffel, Tessenderlo (BE); Cesar Parra, Heverlee (BE)

(73) Assignee: KATHOLIEKE UNIVERSITEIT LEUVEN, Leuven (BE)

(*) Notice: Subject to any disclaimer, the term of this patent is extended or adjusted under 35 U.S.C. 154(b) by 222 days.

(21) Appl. No.: 18/277,302

(22) PCT Filed: Feb. 18, 2022

(86) PCT No.: PCT/EP2022/054035
§ 371 (c)(1),
(2) Date: Aug. 15, 2023

(87) PCT Pub. No.: WO2022/175426
PCT Pub. Date: Aug. 25, 2022

(65) Prior Publication Data

US 2024/0133983 A1 Apr. 25, 2024
US 2024/0230800 A9 Jul. 11, 2024

(30) Foreign Application Priority Data

Feb. 19, 2021 (EP) .................................... 21158173
Jun. 15, 2021 (EP) .................................... 21179597

(51) Int. Cl.
*G01R 33/34* (2006.01)
*B33Y 10/00* (2015.01)
(Continued)

(52) U.S. Cl.
CPC ........ *G01R 33/34007* (2013.01); *B33Y 10/00* (2014.12); *B33Y 80/00* (2014.12); *G01R 33/34084* (2013.01); *G01R 33/58* (2013.01)

(58) Field of Classification Search
CPC .. G01R 33/0052; G01R 33/072; G01R 33/34; G01R 33/34007; G01R 33/34046;
(Continued)

(56) References Cited

U.S. PATENT DOCUMENTS

2005/0179512 A1 8/2005 Weyers et al.
2016/0334479 A1* 11/2016 Poole ..................... A61B 5/055
(Continued)

FOREIGN PATENT DOCUMENTS

JP 2020525309 A 8/2020
WO 2012132463 A1 10/2012

OTHER PUBLICATIONS

Technical Notes for Pelco Conductive Silver Paint.*
(Continued)

*Primary Examiner* — Steven L Yeninas
(74) *Attorney, Agent, or Firm* — DINSMORE & SHOHL LLP

(57) ABSTRACT

Configurations for MRI or NMR measurements include one or more 3D-printed hollow elements, adapted to the shape of an object to be measured. In one or more of the 3D-printed elements, the wall of the elements is made of a UV-curable electrically non-conducting material forming one or more channels. In at least one of the 3D-printed elements having walls, a channel is included, having at least two material plugs of at least two different immiscible materials selected from a dielectric material, an electrically conductive material, and a material with high electrical resistance.

22 Claims, 9 Drawing Sheets

(51) Int. Cl.
*B33Y 80/00* (2015.01)
*G01R 33/58* (2006.01)

(58) Field of Classification Search
CPC ........ G01R 33/34076; G01R 33/34084; G01R 33/385; G01R 33/3858; G01R 33/58; B33Y 10/00; B33Y 50/00; B33Y 80/00
See application file for complete search history.

(56) References Cited

U.S. PATENT DOCUMENTS

| | | | | |
|---|---|---|---|---|
| 2017/0059676 | A1* | 3/2017 | Yang .................. | G01R 33/3858 |
| 2017/0219668 | A1* | 8/2017 | Thiagarajan .......... | B29C 64/188 |
| 2018/0267127 | A1 | 9/2018 | Geiger et al. | |
| 2020/0361138 | A1 | 11/2020 | De Jong et al. | |
| 2024/0085505 | A1* | 3/2024 | Legall ................ | G01R 33/3856 |
| 2024/0192296 | A1* | 6/2024 | Motovilova ....... | G01R 33/3628 |

OTHER PUBLICATIONS

Corea, et al., "Screen-printed flexible MRI receive coils", Nature Communications, vol. 7, pp. 1-7, 2015.
Horche, et al., "3D-printed RF Probeheads for Low-cost, High-throughput NMR", Vanderbilt, pp. 1-3, 2016.
Xie, et al., "3D-printed integrative probeheads for magnetic resonance", Nature Communications, vol. 11, pp. 1-11, 2020.
Horch, et al., "3D-printed RF Probeheads for Low-cost, High-throughput NMR", Proc. Intl. Soc. Mag. Reson. Med. 24 (2016), pp. 1-8.

* cited by examiner

3D PRINTED MRI COIL, PHANTOM AND SHIMMING ELEMENT

CROSS REFERENCES TO RELATED APPLICATIONS

This application is a national-stage application under 35 U.S.C. § 371 of International Application No. PCT/EP2022/054035, filed Feb. 18, 2022, which International Application claims benefit of priority to European Patent Application No. 21158173.1, filed Feb. 19, 2021, and European Patent Application No. 21179597.6, filed Jun. 15, 2021.

FIELD OF THE INVENTION

The invention relates to electronic circuits suitable for use in NMR/MRI/MRS and other MR-related applications fabricated by means of additive manufacturing.

BACKGROUND OF THE INVENTION

The use of nuclear magnetic resonance (NMR)/magnetic resonance imaging (MRI)/magnetic resonance spectroscopy (MRS) scanners is constrained by (i) the lack of homogeneity of the RF and B0 field and (ii) insufficient signal-to-noise ratios (SNR).

Since SNR scales with $1/x^3$, in which x is the distance from the surface coil, it is crucial to place the surface coil as closely as possible to the subject. High costs of such subject-specific RF coils prevent a tailored design in clinical applications.

Screen-printed coils have resulted in the most promising advances in overcoming this issue. Screen-printed coils are semi-flexible and thus can more easily take the form of the patient. A closer fit to the subject increases the SNR while enabling imaging of a wider range of patient sizes and shapes at the same time. The manufacturing of coils by means of screen printing is cumbersome. The screen printing paste is pushed through the screen onto a flexible substrate by means of a squeegee being moved over the screen. Each printed layer is subsequently dried in a furnace. After post-processing, electronic components are soldered onto the screen-printed coils to complete the electronic circuits. These discrete components consist of inductors, capacitors, and resistors that are required for the efficient tuning/matching/detuning and decoupling of the electronic circuit, guaranteeing the efficient energy transfer of the coils. Finally, the flexible substrate on which the coils were printed can be bent around the to-be imaged body part.

Screen-printed coils lack the ability to produce NMR/MRI coils that are fully conformal to the patient as they are 2D prints wrapped around an arbitrarily complex 3D object. Moreover, the manual soldering of the electronic components on the screen-printed coil requires high precision manual labor and is therefore not time-efficient, making the overall coils costly.

Alternatively, Xie et al. (2020) *Nat Commun* 11, 5793 proposed 3D printing MR probeheads by printing channels by means of stereolithography and consecutively filling these channels with liquid metal. This approach allows for more degrees of freedom in probehead design but still fails to overcome the issue of integrating electronic components required for the efficient use of the probehead, especially when aiming at more complex coils for MRI applications.

Corea et al. (2016) 7:10839 and Horch & Gore (2017) Magn Reson Imaging S0730-725X(17)30004-8, disclose 3D printed NMR/MRI coils which comprise conductive and capacitive printed elements.

B0 inhomogeneities are often induced by the subject itself. As each patient's anatomy differs, so will the induced inhomogeneities. Passive and/or active shimming can be applied to nullify these unwanted inhomogeneities. Current passive shimming techniques are cumbersome as they require the manual placement of para-, dia- or ferromagnetic elements in an iterative manner. Active shimming requires less manual labor as a variable current is directed through specialized coil to generate the opposing magnetic field. Current active shimming techniques do not allow for cancelling complex B0 distortions as current techniques are mainly focused on cancelling only the lower harmonic components of the inhomogeneous field. This is due to the difficulty and gih cost of manufacturing active shimming coils specifically maid to fit a specific subject.

SUMMARY OF THE INVENTION

The present invention discloses 3D printing MR coils by printing channels in SLA resin(s) which are then filled/coated/plated with one or more materials to obtain electronic circuits suitable for probing and/or generating electromagnetic fields and/or passively homogenizing B0. The channels are designed/filled so that they will intrinsically contain all electronic components required for the electronic circuit (resistors, capacitors, inductors) and closely fit the patient's specific anatomy. This allows the electronic circuits to be tuned/matched/decoupled/detuned without the need to manually solder discrete electronic components to the 3D printed electronic circuits. To maximize the efficiency of the electronic circuit, a novel multi-material filling approach of the channels is applied.

The invention is further summarized in the following statements:

1. A configuration for MRI or NMR measurements comprising one or more 3D-printed hollow elements, adapted to the shape of an object to be measured wherein in one or more of the 3D-printed elements the wall of the elements is made of a UV-curable electrically non-conducting material forming one or more channels, characterised in that in at least one of the elements with said walls a channel comprises of at least two material plugs of at least two different immiscible materials selected from the group consisting of a dielectric material, an electrically conductive material, and a material with high electrical resistance.
2. The configuration according to statement 1 wherein the material plugs form an electric circuit or parts thereof.
3. The configuration according to statement 1 or 2, wherein the elements form loops.
4. The configuration according to statement 1 or 2, wherein the channel comprises immiscible material plugs of a dielectric material, a conductive material, and a material with high electrical resistance.
5. The configuration according to any one of statements 1 to 4, wherein the channel comprises a conductive material and further a dielectric material or a material with high electrical resistance.
6. The configuration according to any one of statements 1 to 5, wherein in all of the one or more 3D-printed elements, the wall of the element is made of a UV-curable material forming one or more channels.
7. The configuration according to any one of statements 1 to 6, wherein the wall of the element, made of UV curable material, forms a single channel.

8. The configuration according to any one of statements to 7, which is adapted to the anatomy of a body or body part of an animal or human subject.
9. The configuration according to any one of statements 1 to 8, wherein one or more of said electric circuits are connected with one or more electronic circuit boards, thereby allowing the control of matching, tuning, detuning, and decoupling of the individual elements.
10. The configuration according to any one of statements 1 to 9, wherein 3-D printed elements are manufactured by means of VAT polymerization or direct material melting printing.
11. The configuration according to any one of statements 1 to 10, wherein the 3D printed elements are flexible.
12. The configuration according to any one of statements 1 to 11, further comprising additional channels with a material to control the temperature of the elements.
13. Use of the configuration according to any one of statements 1 to 12, in one or more role selected from transmitting RF signals, receiving RF signals, or homogenizing magnetic fields.
14. A method for producing a configuration as defined in any one of statements 1 to 12:
    a) providing geometrical data of an object to be measured,
    b) defining the external shape of a loop or element configuration to adapt to the shape of the object by means of electromagnetic simulations and/or design computing and/or generative modeling, resulting in a CAD design of the configuration,
    c) calculating volumes and sequence delivery of dielectric material, conductive material, or material with high electrical resistance to achieve the electronic circuit or parts thereof,
    d) 3D printing the element or loop configuration in accordance with the calculations in step b) and step c), wherein the walls of the element or loop form one or more channels and are made of a UV curable electrically non-conducting material and
    e) filling at least one channel in at least one of the loops or elements loop or elements prepared in d) with at least two material plugs of at least two different immiscible materials selected from the group consisting of a dielectric material, an electrically conductive material, and a material with high electrical resistance in accordance with of the volumes and sequence delivery calculated in step system c).
15. The method according to statement 14, wherein the elements are printed as loops.
16. The method according to statement 15, wherein filling of a channel or designated part of a channel with inductive components is performed by filling the designated part of the channel with conductive material or is performed by electroplating either the inner or outer wall of the designated part of the coil configuration with a conductive layer.
17. The method according to statement 15 or 16, wherein capacitive components of the equivalent RLC circuit are manufactured by manipulating the length, shape, and sequence of material plugs inside the section of the channel designated to capacitive components.
18. The method according to statement 14 or 16 wherein inductive components of the equivalent RLC circuit are manufactured by manipulating the length, shape, and sequence of material plugs inside the section of the channel designated to inductive components.
19. The method according to statement 15 or 16, wherein the resistance of the equivalent RLC circuit is acquired by manipulating the length, shape and sequence of material plugs inside the section of the channel designated to resistive components.
20. The method according to any one of statements 15 to 19, wherein the capacitive components are alternatively filled by filling said channel with conductive, and a high-dielectric fluid and wherein a further connection connects the loops or elements in such a way that the channels of different elements or loops form multiple capacitors in parallel as opposed to the initial in-series configuration.
21. The method according to any one of statements 15 to 20, further comprising the step of using electromagnetic simulation software to design the electronic circuit that meets the performance requirements based on experimental requirements.
22. The method according to any one of statements 15 to 21, wherein a plurality of loops or elements are connected and wherein a plurality of channels are filled with a single sequence of material plugs.
23. A configuration for MRI or NMR measurements comprising one or more 3D-printed loops, adapted to the shape of an object to be measured, characterized in that the one or more 3D-printed loops contain a channel comprising immiscible material plugs of at least two materials selected from the group consisting of a dielectric material, an electrically conductive material, and a material with high electrical resistance, wherein these material plugs form an electric circuit or parts thereof.
24. The configuration according to statement 23, wherein the channel comprises immiscible material plugs comprising a dielectric material, a conductive material, and a material with high electrical resistance.
25. The configuration according to statement 23 or 24, which is adapted to the anatomy of a body or body part of an animal or human subject, such as head, torso, knee.
26. The configuration according to any one of statements 23 to 25, wherein one or more of said electric circuits are connected with one or more electronic circuit boards, thereby allowing the control of matching, tuning, detuning, and decoupling of the individual loops.
27. The configuration according to any one of statements 23 to 27, wherein 3-D printed loops are manufactured by means of VAT polymerization or direct material melting printing.

Herein any additive manufacturing methods could be utilized. Examples are VAT polymerization (stereolithography, digital light processing continuous digital light processing), direct material melting (Fused deposition modeling, arburg plastic freeforming), sheet lamination (Laminated object manufacturing), direct energy deposition (Laser engineering net shape, electron beam additive manufacturing), binder jetting (Binder jetting), material jetting/inkjetting (Multi jet modeling/poly jetting nanoparticle jetting drop on demand), powder bed fusion (Multi jet fusion, selective laser sintering, Selective laser melting, Electron beam melting)

28. The configuration according to any one of statements 23 to 27, wherein the 3D-printed loops are a non-conductive polymer.
29. The configuration according to any one of statements 23 to 28, wherein the dielectric material has a dielectric constant of at least 3.

30. The configuration according to any one of statements 23 to 29, wherein the conductive material has an electrical conductivity above 10^2 S/m at 20° C.
31. The configuration according to any one of statements 23 to 30, wherein the material with high resistance has a resistivity above 10 Ohm/m.
32. The configuration according to any one of statements 23 to 31, wherein the immiscible material plugs have a viscosity of at least 0.1 mPa*s.
33. The configuration according to any one of statements 23 to 32, wherein the 3D printed loops are flexible.
34. The configuration according to any one of statements 23 to 33, further comprising additional channels with a material to control the temperature of the loops.
35. Use of the configuration according to any one of statements 23 to 34, in one or more roles selected from transmitting RF signals, receiving RF signals, or homogenizing magnetic fields.
36. A method for producing a configuration as defined in any one of statements 23 to 34:
a) providing geometrical data of an object to be measured,
b) defining the external shape of the loop configuration to adapt to the shape of the object by means of electromagnetic simulations and/or design computing and/or generative modeling, resulting in a CAD design of the loop configuration,
c) calculating volumes and sequence delivery of dielectric material, conductive material, and material with high electrical resistance to achieve the electronic circuit or parts thereof. This results in a digital plug flow sequence.
d) 3D printing the loop configuration in accordance with the calculations in step b) and step c) and
e) filling internal channels of the loops with the dielectric material, conductive material acting material with high resistance, in accordance with the calculations in step system c).
37. The method of statement 36, wherein filling the internal channel of inductive components is performed by filling the designated part of the loop with conductive material or is performed by electroplating either the inner or outer wall of the designated part of the coil configuration with a conductive layer.
38. The method of statement 36 or 37, wherein capacitive components of the equivalent RLC circuit are manufactured by manipulating the length, shape and sequence of material plugs inside the section of the channel designated to capacitive components.
39. The method of statement 36, wherein the resistance of the equivalent RLC circuit is acquired by manipulating the length, shape and sequence of material plugs inside the section of the channel designated to resistive components.
40. The method according to any one of statements 36 to 39, further comprising the step of connecting an MCX connector to each individual loop in the designated section of the CAD design and fixating the MCX connector with a durable resin to allow the connection of the required circuit boards
41. The method according to any one of statements 36, wherein the capacitive components are alternatively filled by filling said channel with conductive, and a high-dielectric fluid and wherein a further secondary channel connects the channels in such a way that the channels form multiple capacitors in parallel as opposed to the initial in-series configuration.

The filling of this capacitor configuration happens in two stages:

Stage 1: Filling plug sequence in a single channel. Precise positioning possible because of (i) digital plug generation, (ii) known volume of both channels and injected plugs, (iii) preventing infusion into side channels through air pressure build-up (blocked-off with custom print in flexible material) and angle or due to the pressure from a conductive liquid reservoir.

Stage 2: Removing blockages of side channels and infuse via vacuum method. Capacitors are now hooked up in parallel to increase the capacitance.

42. The method according to any one of statements 36 to 41, further comprising the step of using electromagnetic simulation software to design the electronic circuit that meets the performance requirements based on experimental requirements
43. The method according to statement 36, wherein the filling is performed by an automated flow control and valve control system.
44. The method according to any one of statements 36 to 44, wherein a plurality of loops are connected and wherein the plurality is filled with a single sequence of material plugs. As an alternative to filling each individual loop of a phased-array separately, all loops are connected temporarily head to tail with connectors to allow filling in a single operation.
45. The method according to any one of statements 36 to 44, wherein prior to step e) parts of the inner channel wall of the loops are coated with a layer changing its physiochemical properties. The layer can exhibit either an omniphobic, a hydrophobic, or oleophobic functionality acting as a slip layer for the material plugs.
46. The method according to any one of statements 36 to 45, wherein prior to step e) parts of the channels of the loops are treated to modify surface roughness of the channel wall.

Overview of proposed workflow: Input data is obtained, e.g., anatomy of subject for which the coils must be shape-conform, coil functionality (RF receive, RF transmit, active shim, etc.) (2) Using a magnetic field and electronic circuit simulating software an electronic circuit scheme is produced. (3a) This electronic circuit is translated to a CAD design consisting of a complex channel network using a generative modeling approach. (3b) The CAD design, as well as the required electronic components and their respective properties (Resistance, capacitance, inductance), are used as input to produce a digital multi-material plug flow sequence (in-house developed software). (4) De CAD designs are printed using a stereolithography-based 3D printing method. (5) The 3DP electronic circuit is filled with the multi-material plug flow sequence, resulting in a readily usable coil.

Figure 2:
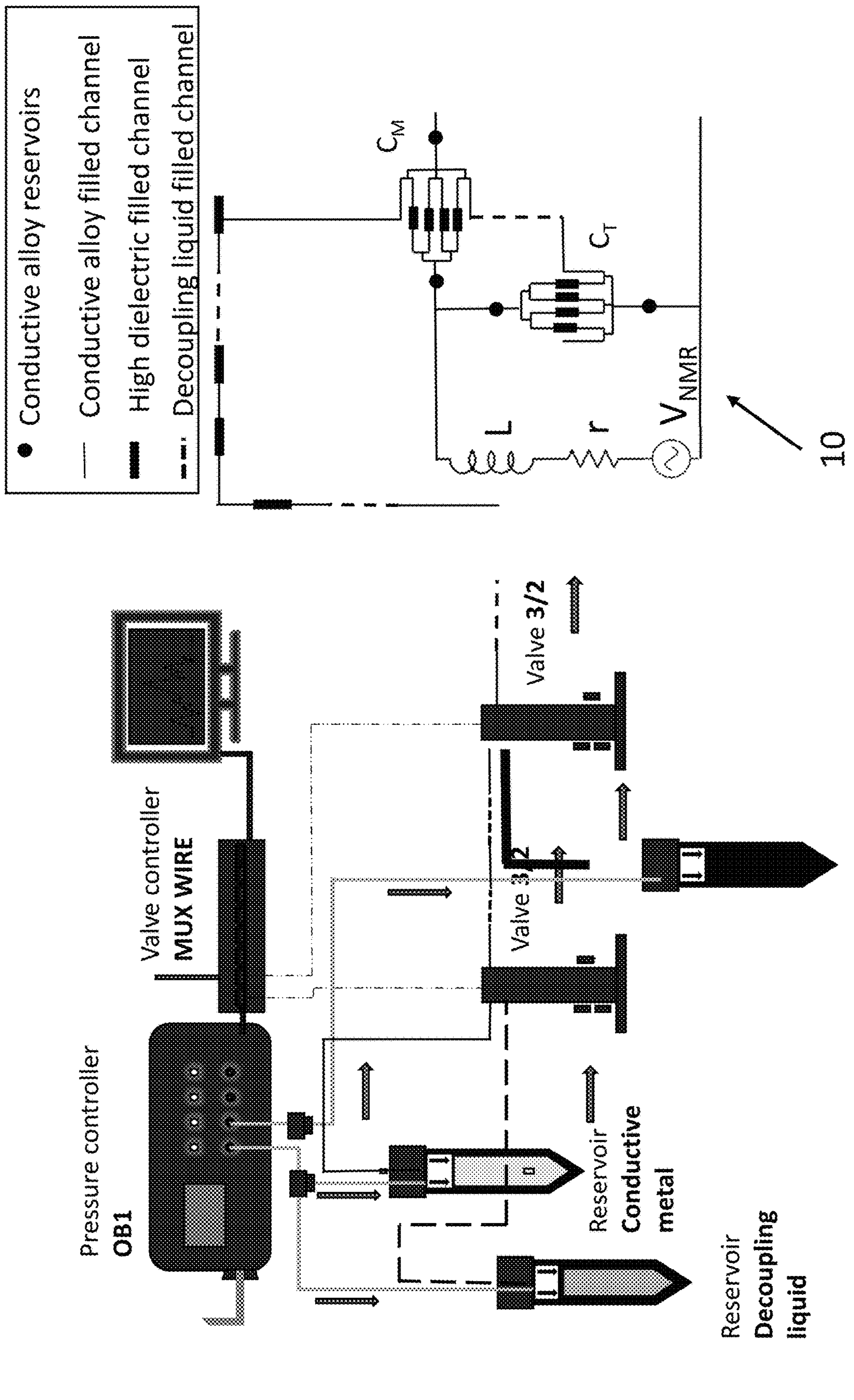

FIG. 2:

Schematic overview showing how the plug flow will be generated in the Elveflow setup. A flow controller and valves will simultaneously be controlled to regulate the volumes and sequence of the liquid plugs designated for each specific component of the channel circuit. Flow sensors can be added to ensure/calibrate the liquid-liquid plug flow system. FIG. 2 also shows an electrical circuit board by which the present disclosure may be connected.

Figure 3:
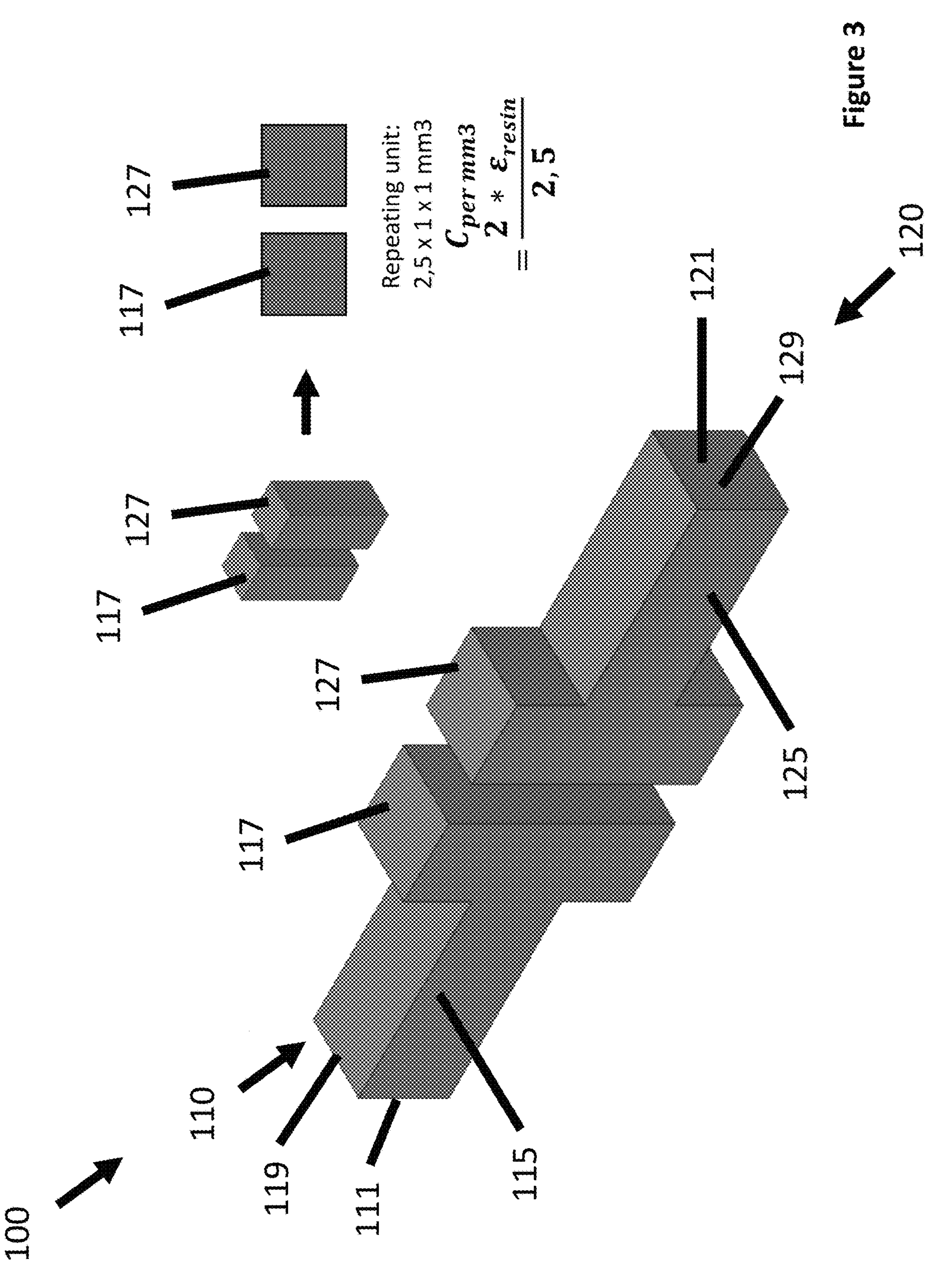

FIG. 3:

FIG. 3 shows a schematic of a reference capacitor element comprising of two 3D-printed hollow elements, the walls of which create channels that are filled with material plugs.

Figure 4:
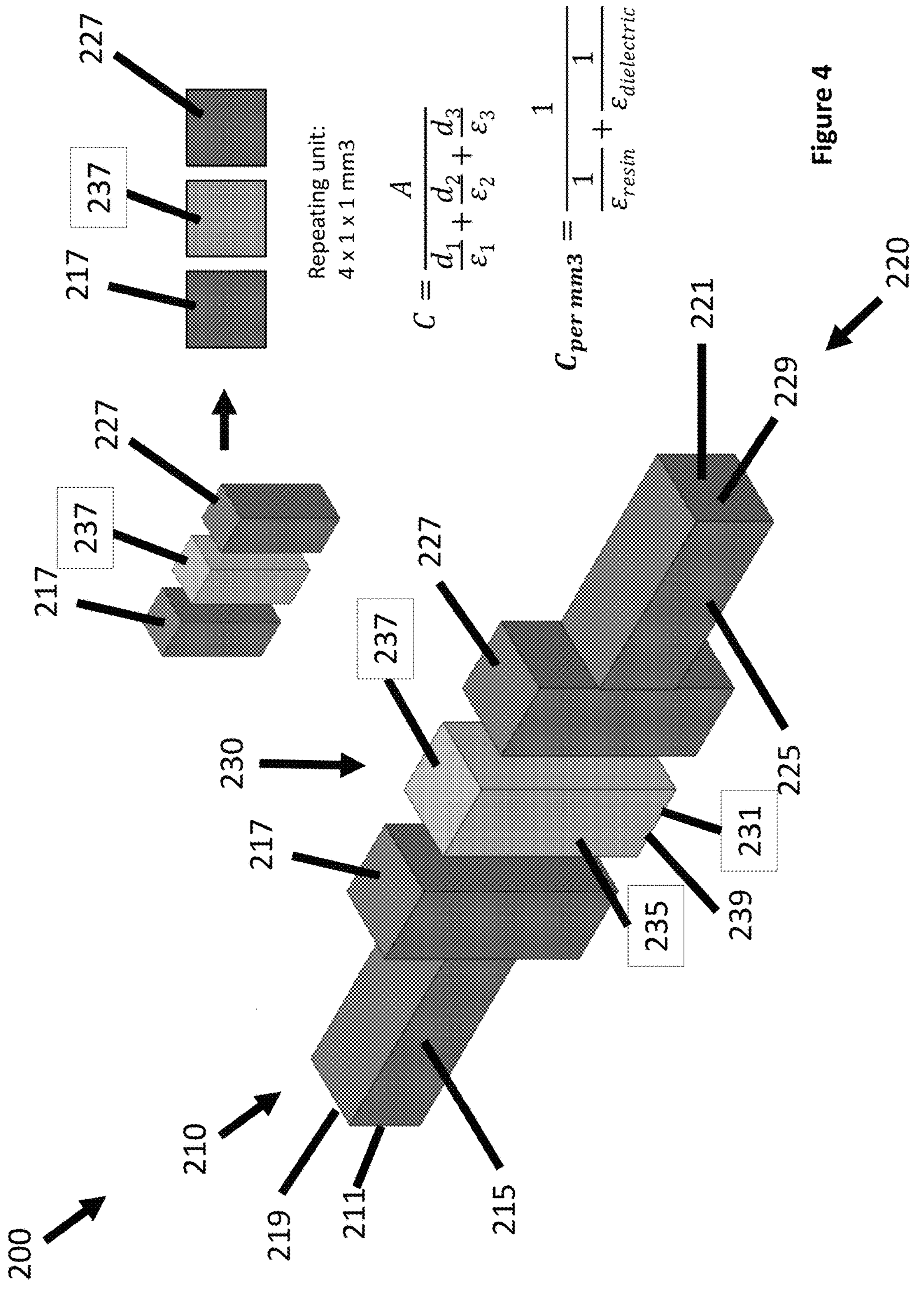

FIG. 4:

FIG. 4 is a triple channel capacitor comprising three 3D-printed hollow elements, the walls of which create channels that are filled with material plugs.

Figure 5:
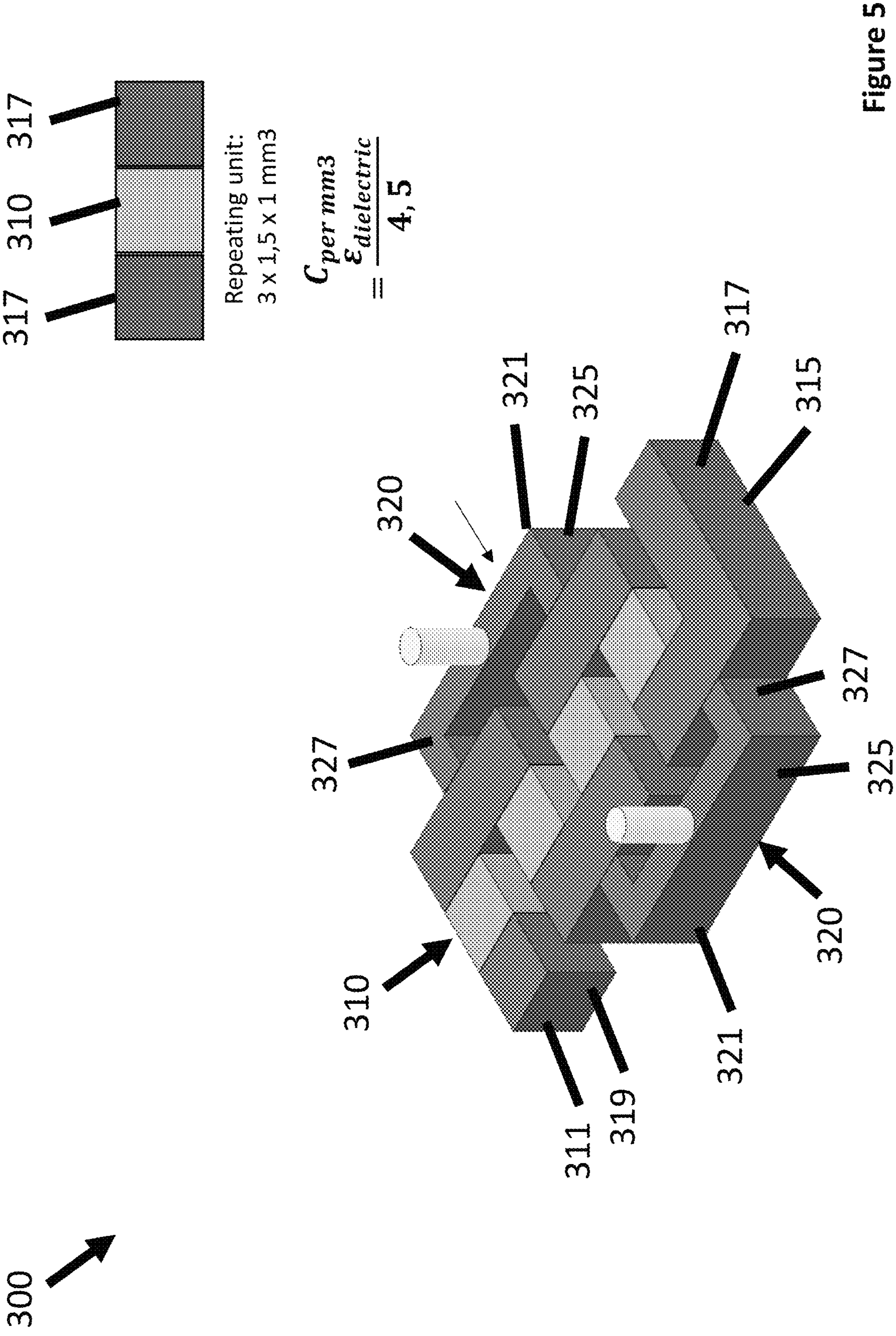

FIG. 5:

FIG. 5 depicts the two-stage filling of a parallel channel capacitor, the parallel channel capacitor comprising of three 3D-printed hollow elements, the walls of which create channels that are filled with material plugs.

Figure 6:
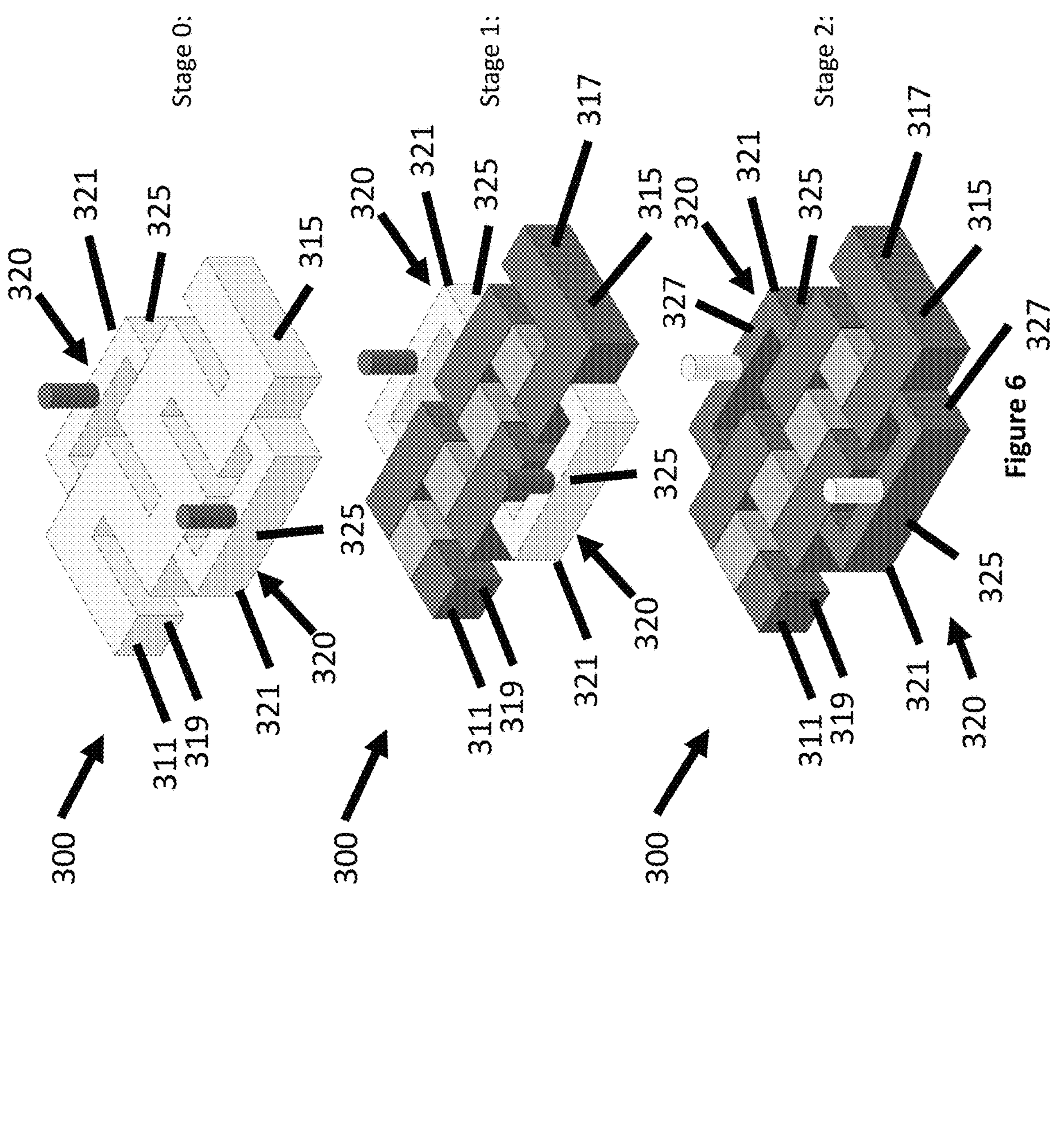

FIG. 6:

FIG. 6 depicts a two-stage filling method of a parallel channel capacitor: In the first stage of the filling of the two-stage filling method for parallel channel capacitor, the primary channel will be filled with a sequential liquid-liquid-liquid plug flow which is controlled by the Elveflow setup. In the second stage (after filling of the primary channel is complete) the secondary channels will be filled using the vacuum fill method. This way, the individual capacitors are placed in parallel, greatly increasing the maximum volumetric capacitance.

Figure 7:
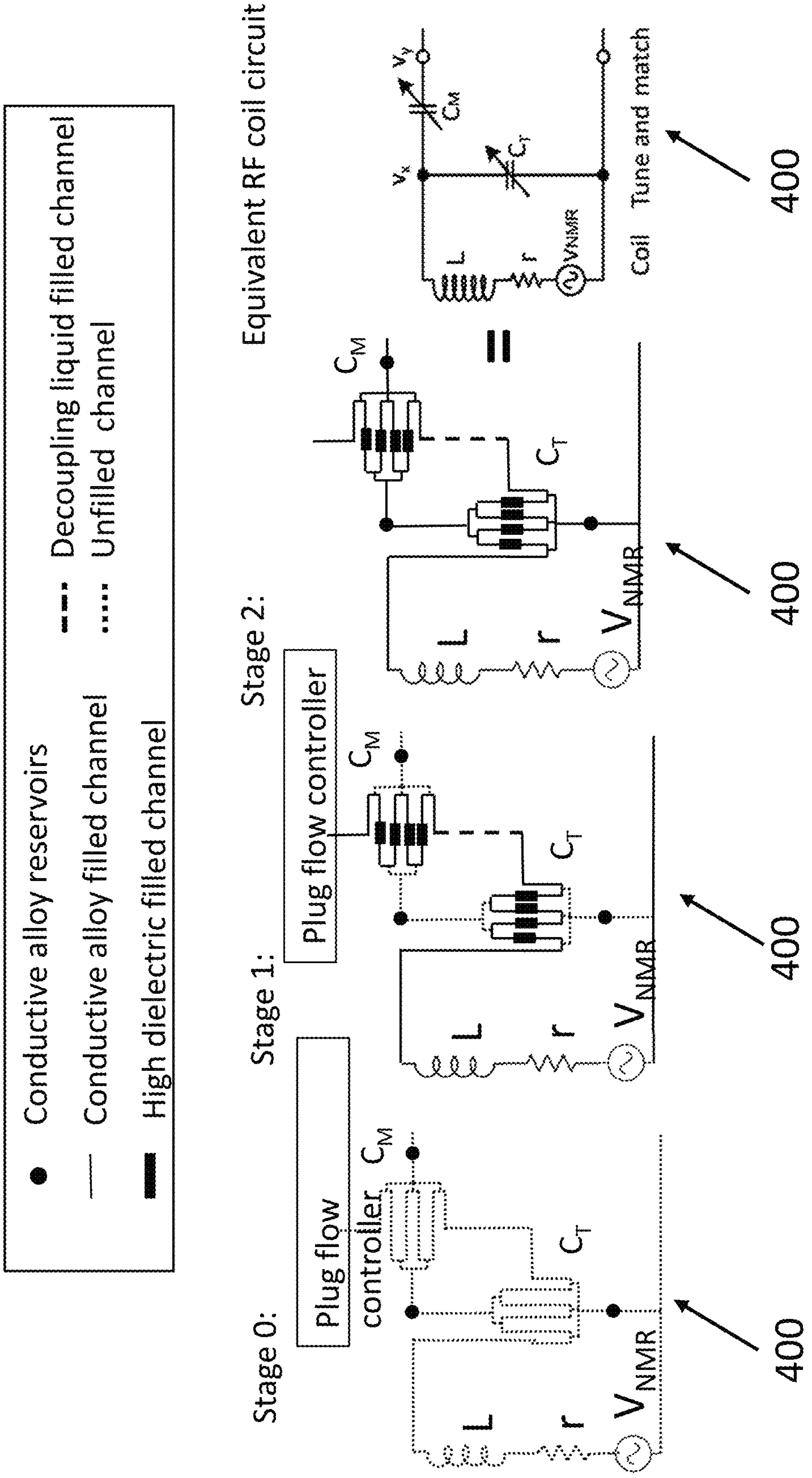

FIG. 7:

(Left) Schematic overview of how this circuit will be converted to a CAD design consisting of a complex network of primary and secondary channels (stage 0). In the first stage of the filling of the two-stage filling method for parallel channel capacitor, the primary channel will be filled with a sequential liquid-liquid-liquid plug flow which is controlled by the Elveflow setup. In the second stage (after filling of the primary channel is complete), the secondary channels will be filled using the vacuum fill method. This way, the individual capacitors are placed in parallel, greatly increasing the maximum volumetric capacitance. (Right) Electronic circuit for an RF coil with a tune and match circuit. Each depiction of FIG. 7 is an electric circuit by which the current disclosure may connected.

FIG. 8:

Additional channels besides the MR channels can be utilized for temperature control:

(A): Channels can be conformally wound to the MR coil channel or to the conformally fit the to be analyzed subject (B): Temperature control channels can be located internally (circumferencing) to the MR coil channel (C): The MR coil channel can be located internally (circumferencing) to the temperature control channel

FIG. 9:

Filling aid: The filling aid connects to all individual inlets/outlets of the complex coil array (black arrows). This approach connects all the individual channels to the main (single) channel of the filling aid.

DETAILED DESCRIPTION OF THE INVENTION

This invention relates to manufacturing electronic circuits suitable for use in NMR/MRI/MRS and other MR-related applications where there is a need for cost and time-efficient, complex electronic circuit geometries. More specifically, the invention provides the production of subject-specific (and/or generic) RF and/or active shim coils and/or passive shim configurations. The present invention can also be used for other applications requiring electronic circuits such as gradient coils and impedance sensing.

A first aspect of the invention relates to configurations for MRI or NMR measurements comprising one or more 3D-printed hollow elements, adapted to the shape of an object to be measured wherein in one or more of the 3D-printed elements the wall of the elements is made of a UV-curable electrically non-conducting material forming one or more channels, characterised in that in at least one of the elements with said walls a channel comprises of at least two material plugs of at least two different immiscible materials selected from the group consisting of a dielectric material, an electrically conductive material, and a material with high electrical resistance.

Typically these material plugs form an electric circuit or parts thereof.

Typically the elements form loops. For certain applications such as passive shimming the elements can have other shapes.

In embodiments of the configuration a channel comprises immiscible material plugs of a dielectric material, a conductive material, and a material with high electrical resistance.

In embodiments of the configuration a channel comprises a conductive material and further a dielectric material or a material with high electrical resistance.

In embodiments of the configuration in all of the one or more 3D-printed elements, the wall of the element is made of a UV-curable material forming one or more channels.

In specific embodiments of the configuration the wall of the element, made of UV curable material, forms a single channel.

Typically the configuration is adapted to the anatomy of a body or body part of an animal or human subject, such as head or torso. The configuration is typically applied to the outside of the animal or human, but application wherein the configuration is used inside the body are also envisaged. Equally applications are foreseen whereby the configuration is used on/in plants and other living organism, and non living objects.

In embodiments of the configuration one or more of said electric circuits are connected with one or more electronic circuit boards, thereby allowing the control of matching, tuning, detuning, and decoupling of the individual elements.

In embodiments of the configuration 3-D printed elements are manufactured by means of VAT polymerization (stereolithography, digital light processing continuous digital light processing, direct material melting (Fused deposition modeling, arburg plastic freeforming), sheet lamination (Laminated object manufacturing), direct energy deposition (Laser engineering net shape, electron beam additive manufacturing), binder jetting (Binder jetting), material jetting/inkjetting (Multi jet modeling/poly jetting nanoparticle jetting drop on demand, powder bed fusion (Multi jet fusion, selective laser sintering, Selective laser melting, Electron beam melting).

In embodiments of the configuration the 3D printed elements are flexible.

Figure 8:
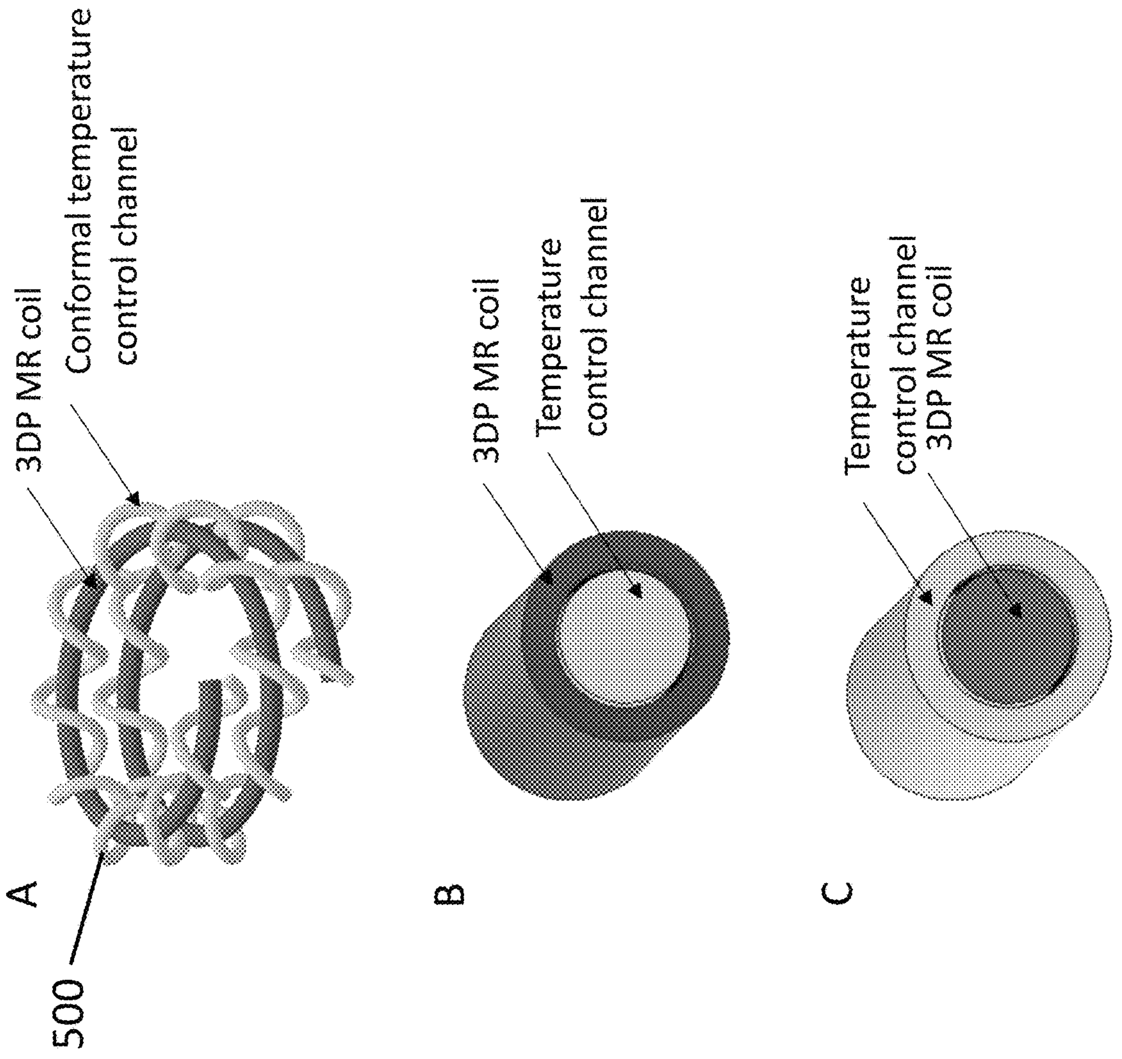

In embodiments of the configuration the configuration further comprising additional channels 500 with a material to control the temperature of the elements. The additional channels 500 are depicted in FIG. 8. This channels for temperature control can be applied on the outside of the elements. In a specific embodiment wherein an element comprises two or more channels one of the channels inside the element can be used for the temperature control.

Herein, the dielectric material has for example a dielectric constant of at least 3.

Herein, the conductive material has for example an electrical conductivity above $10^2$ S/m at 20° C.

Herein the material with high resistance has for example a resistivity above 10 Ohm/m.

Herein, the immiscible material plugs have for example a viscosity of at least 0.1 mPa*s.

The configuration of the present invention differs from e.g. Corea et al. cited above in that an element or loop is entirely made of a UV-curable material that is non-electric conductive. The UV-curable material of the element or loop forms the wall of an internal channel. In this channel the different materials plugs are a within the channel along the longitudinal axis of the channel.

The configuration of the present invention differs from e.g. Horch and Gore cited above in that the UV-curable material is non-electric conductive.

Another aspect of the invention relates to the use of the above configuration in one or more role selected from transmitting RF signals, receiving RF signals, or homogenizing magnetic fields.

Another aspect of the invention relates to methods for producing a configuration as described in the first aspect, which comprise the following step:

a) providing geometrical data of an object to be measured,
b) defining the external shape of a loop or element configuration to adapt to the shape of the object by means of electromagnetic simulations and/or design computing and/or generative modeling, resulting in a CAD design of the configuration,
c) calculating volumes and sequence delivery of dielectric material, conductive material, or material with high electrical resistance to achieve the electronic circuit or parts thereof,
d) 3D printing the element or loop configuration in accordance with the calculations in step b) and step c), wherein the walls of the element or loop form one or more channels and are made of a UV curable electrically non-conducting material and
e) filling at least one channel in at least one of the loops or elements loop or elements prepared in d) with at least two material plugs of at least two different immiscible materials selected from the group consisting of a dielectric material, an electrically conductive material, and a material with high electrical resistance in accordance with of the volumes and sequence delivery calculated in step system c).

Typically the elements are printed as loops. In applications such as active shimming other shapes or configurations can be used Typically the filling of a channel or designated part of a channel with inductive components is performed by filling the designated part of the channel with conductive material or is performed by electroplating either the inner or outer wall of the designated part of the coil configuration with a conductive layer.

In embodiments of these methods, capacitive components of the equivalent RLC circuit are manufactured by manipulating the length, shape, and sequence of material plugs inside the section of the channel designated to capacitive components.

In embodiments of these methods, inductive components of the equivalent RLC circuit are manufactured by manipulating the length, shape, and sequence of material plugs inside the section of the channel designated to inductive components.

In embodiments of these methods, the resistance of the equivalent RLC circuit is acquired by manipulating the length, shape and sequence of material plugs inside the section of the channel designated to resistive components.

In embodiments of these methods the capacitive components are alternatively filled by filling said channel with conductive, and a high-dielectric fluid and wherein a further connection connects the loops or elements in such a way that the channels of different elements or loops form multiple capacitors in parallel as opposed to the initial in-series configuration.

Embodiments of these methods comprise a further the step of using electromagnetic simulation software to design the electronic circuit that meets the performance requirements based on experimental requirements.

In embodiments of these methods a plurality of loops or elements are connected and a plurality of channels are filled with a single sequence of material plugs.

Embodiments of these methods, further comprise the step of connecting an MCX connector to each individual loop in the designated section of the CAD design and fixating the MCX connector with a durable resin to allow the connection of the required circuit boards In embodiments of these methods the capacitive components are alternatively filled by filling said channel with conductive, and a high-dielectric fluid and wherein a further secondary channel connects the channels in such a way that the channels form multiple capacitors in parallel as opposed to the initial in-series configuration The filling of such capacitor configuration happens in two stages:

Stage 1: Filling plug sequence in a single channel.

Precise positioning possible because of (i) digital plug generation, (ii) known volume of both channels and injected plugs, (iii) preventing infusion into side channels through air pressure build-up (blocked-off with custom print in flexible material) and angle or due to the pressure from a conductive liquid reservoir.

Stage 2: Removing blockages of side channels and infuse via vacuum method.

Capacitors are now hooked up in parallel to increase the capacitance.

Embodiments of these methods, further comprise the step of using electromagnetic simulation software to design the electronic circuit that meets the performance requirements based on experimental requirements In embodiments of these methods, the filling is performed by an automated flow control and valve control system In embodiments of these methods, a plurality of loops are connected and wherein the plurality is filled with a single sequence of material plugs. As an alternative to filling each individual loop of a phased-array separately, all loops are connected temporarily head to tail with connectors to allow filling in a single operation In embodiments of these methods, prior to step e) parts of the inner channel wall of the loops are coated with a layer changing its physiochemical properties. Such layer can exhibit either an omniphobic, a hydrophobic, or oleophobic functionality acting as a slip layer for the material plugs.

In embodiments of these methods, prior to step e) parts of the channels of the loops are treated to modify surface roughness of the channel wall.

Below a detailed but non-limiting list of different coil configurations for which the invention is readily applicable is given:

RF Coils
- Receive mode only, transmit mode only, transceiver RF coil
- Volume coils (e.g., circularly polarized coil, quadrature coil, birdcage coil, crossed coil, Helmholtz pair coil, paired saddle coil, single turn solenoid, etc.)
- Surface coils (e.g., array coil, body wrap-around coil, linearly polarized coil, saddle coil, etc.)
- Transmission line resonator and/or resonant circuit coils probes for NMR (transmit and receive mode)
- RF coils with conformal heating/cooling Active Shim Coils
- Self-cooling, conformal cooling
- Spherical harmonic coils (Maxwell coil, Helmholtz coil, etc.)
- Multi-coil arrays Other Specific Applications:
- 3D printed phantoms with/without embedded coils
- 3D printed personalized immobilization device for MRI guided radiotherapy that contains RF coils embedded in the immobilization device
- passive shim configurations Starting from patient-specific input data, an electronic circuit is simulated that meets the requirements of the to-be manufactured coil (e.g., anatomy data to determine the conformal fit of coils, coil type, etc.). This electronic circuit is then translated into a CAD design consisting of a complex channel network. The software required for this step uses a generative modeling approach.

Figure 1:
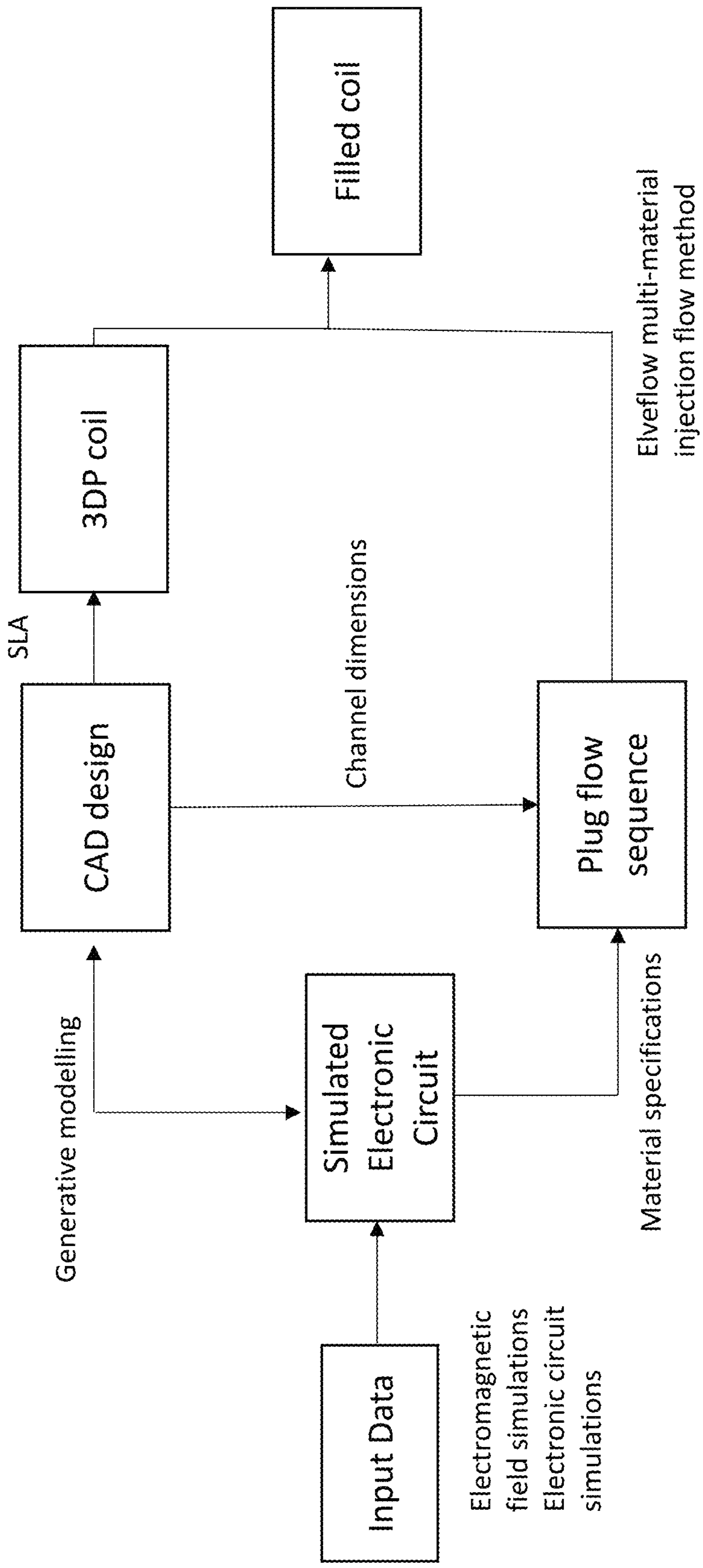
FIG. 1.

The electronic circuit components are taken into account in the CAD design. The CAD design for each unit coil (array coils consist of multiple unit coils) consists of a single uninterrupted channel. This single uninterrupted channel branches out, forming a complex network of primary and secondary channels. The single channel is filled in such a way that the performance of each electronic component (resistor, inductor, capacitor) is maximized. The resistor components are filled with a highly resistive material, inductors with a highly conductive material, and the capacitors are alternatively filled with high dielectric and conductive materials. Therefore the primary channel is filled with a sequence of material plugs. The filling of the primary channel is pre-calculated as well as automated by the use of the Elveflow multi-material injection method, depicted in FIG. 2. FIG. 2 further demonstrates an electrical circuit 10 by which the present disclosure may be connected. Software calculates the pressure and valve timings necessary to create material plugs with the correct length to properly fill the primary channel. The length of each plug is calculated from the CAD design that was previously generated. A schematic overview of the proposed work method is depicted in FIG. 1.

The 3D printed channels may or may not be pre-processed to functionalize the inner walls to aid in the filling/plating of the channel itself (e.g., change surface tension behavior, surface roughness, etc.). The pre-processing can be chemical of nature, for example:
- Chemically manipulate the contact angle of the resin and thus its wetting properties, e.g., by application of omniphobic coatings.
- Manipulating the electric properties of the resin, e.g., by coating with a conductive seed layer.

The pre-processing can also be mechanical; for example, applying a halftoning process during the curing of each individual layer to induce surface roughness in the SLA printed inner channel walls. Increased surface roughness of the inner channel wall can be exploited to increase the contact angle of the liquid inside the channel (Cassies's Law). An increased contact angle is desirable when filling the channels with multiple liquids because by reducing the wetting properties of each liquid, each individual "liquid plug" will maintain its shape and not leave a liquid "tail" behind when being pushed through the channel.

The composition of the resin(s) can be modified to achieve a certain functionality of the final resin part:
- The resin(s) can be modified to contain particles to add desired functionality to the final 3D printed parts (e.g., high dielectric particles to increase the dielectric properties of the resin).
- Resin(s) can be biocompatible.
- Resin(s) can be flexible.

The required electronic circuit is converted into a CAD design which consists of a channel network. The channel network is composed of a single main channel, the "primary channel", which is connected at specific places with secondary channels.

The purpose of the secondary channels is to ensure that capacitors are placed in parallel as opposed to in series in the final CAD design, thus ensuring high capacitance (see capacitor designs).

The primary channel is designed in such a way that it mimics the electronic circuit 400: sections of the primary channel are designed to feature resistive structures, others sections are designed to feature inductors, and other sections of the primary channel are designed to feature capacitors. The different electronic CAD components require to be filled with different materials to maximize the efficiency of energy transfer in the resonant coil. The primary channel is consecutively filled with different material plugs of a certain length corresponding to the length required in the designated 3D printed channel for that specific electronic component. Calculations of the plug length/volume are based on the channel geometry (CAD design). This information is translated by software to simultaneously control the flow controller and valves of the Elveflow system to regulate the liquid-liquid plugs. In an embodiment of the invention, three liquid materials are used for the formation of: (1) conductive plugs, (2) high dielectric plugs, and (3) high resistive plugs. The methods of the present invention, however, can be extrapolated to filling complex 3D printed channel networks with any amount of liquids with specific functionalities. A schematic overview of how the plug flow sequence, required for filling the 3D printed channels, is generated is depicted in FIG. 7. FIG. 7 demonstrates this using an electric circuit 400.

The CAD design can not only take into account the inductor loops but also (all) other components of the electronic circuit. This results in a coil that is tuned/matched/detunable/decoupled from other coil circuits as is. No electronic components are necessarily required to be soldered onto the coil afterward fabrication.

By manipulating the length/shape/curvature/material plug inside of the channel section designated to resistive components, the resistance of the electronic circuit can be manipulated.

By manipulating the length/shape/number, size and configurations of windings/material of the plug inside of the channel section designated to inductive components, the inductance of the electronic circuit can be manipulated.

By manipulating the length/shape/material plug inside of the channel section designated to capacitive components, the capacitance of the electronic circuit can be manipulated. (Important for tuning/matching RF coils).

In the CAD design, different capacitor configurations can be used:

1 Reference capacitor: channels filled with conductive material to form the respective electrodes. SLA resin in between channels acts as the dielectric material. Complex shapes can be designed to increase the maximum achievable capacitance/$mm^3$ (e.g., spiral wound capacitors, parallel plate capacitors, etc.). FIG. 3 depicts a reference capacitor 100. The reference capacitor 100 comprises a first 3D-printed hollow element 110 and a second 3D-printed hollow element 120. As described above, both 3D-printed hollow elements are formed from UV-curable electrically non-conducting material. With respect to the first 3D-printed hollow element 110, the UV-curable electrically non-conducting material forms first channel walls 115 that then create a first channel 111. The first channel 111 contains an inlet 119 for a first channel material plug 117 to fill the first 3D-printed hollow element 110. With respect to the second 3D-printed hollow element 120, the UV-curable electrically non-conducting material forms second channel walls 125 that then create a second channel 121. The second channel 121 contains a second inlet 129 for a second channel material plug 127 to fill the second 3D-printed hollow element 120.

2 Triple channel capacitor: two channels are filled with a conductive material to form the electrodes of the capacitors, a third channel is placed in between the electrode channels which is filled with a material with a high dielectric material to increase the capacitance. FIG. 4 depicts a triple channel capacitor 200. The triple channel capacitor 200 contains a first 3D-printed hollow element 210, a second 3D-printed hollow element 220, and a third 3D-printed hollow element 230. As described above, all three 3D-printed hollow elements are formed from UV-curable electrically non-conducting material. With respect to the first 3D-printed hollow element 210, the UV-curable electrically non-conducting material forms first channel walls 215 that then create a first channel 211. The first channel 211 contains an inlet 219 for a first channel material plug 217 to fill the first 3D-printed hollow element 210. With respect to the second 3D-printed hollow element 220, the UV-curable electrically non-conducting material forms second channel walls 225 that then create a second channel 221. The second channel 221 contains a second inlet 229 for a second channel material plug 227 to fill the second 3D-printed hollow element 220. With respect to the third 3D-printed hollow element 230, the UV-curable electrically non-conducting material forms third channel walls 235 that then create a third channel 231. The third channel 231 contains an inlet 239 for a third channel material plug 237 to fill the third 3D-printed hollow element 230.

3 Two-stage capacitor: FIG. 5 depicts a two-stage capacitor 300. The two-stage capacitor 300 comprises of a consecutive 3D-printed hollow element 310 and two secondary 3D-printed hollow elements 320. The consecutive 3D-printed hollow element 310 comprises of UV-curable electrically non-conducting material forming consecutive channel walls 315 that then create a consecutive channel 311. The consecutive channel 311 contains a consecutive filling inlet 319 for a consecutive channel material plug 317, the consecutive channel material plug 317 used to fill the consecutive 3D-hollow printed element 310. The two secondary 3D-hollow printed elements 320 comprise of UV-curable electrically non-conducting material forming secondary channel walls 325 that then create secondary channels 321. The secondary channels 321 are filled with secondary channel material plugs 327. The the two-stage capacitor 300 is configured as follows: the consecutive channel 311 is alternatively filled with conductive and a high dielectric fluid (see plug flow filling). These materials may constitute the consecutive material plug 317 and the secondary material plugs 327. Secondary channels 321 connect the consecutive channel 311 in such a way that the consecutive channel 311 forms multiple capacitors in parallel as opposed to the initial in-series configuration. The filling of this capacitor configuration happens in two stages (FIG. 6).

Stage 1: Fill plug sequence in the consecutive channel 311. Precise positioning possible because of (i) digital plug generation, (ii) known volume of both channels and injection, (iii) preventing infusion in secondary channels 321 through air pressure (blocked-off with custom print in flex material) and angle or due to the pressure from a conductive liquid reservoir. As show in in FIG. 6, this step essentially consists of filling the consecutive 3D-printed hollow element 310 with the consecutive channel material plug 317.

Stage 2: Remove blockages of secondary channels 321 and infuse via vacuum method. Since the secondary channels 321 are short, there will be no issue of plugs moving around (rapidly reached vacuum). Capacitors are now hooked up in parallel to increase the capacitance. As shown in FIG. 6, this step essentially consists of filling the two secondary 3D-hollow printed elements 320 with the secondary material plugs 327.

Capacitors may or may not be variable capacitors (adjustment of capacitance is possible), by manipulating the amount of dielectric material/size of conductive plugs with pressure change after the coil has been filled and assembled.

An example how an electronic circuit (RF coil and integrated tune and match circuit) can be translated to a CAD design and digital plug flow sequence is outlined as follows.

Filling method:

Two different filling methods are used as embodiments for the manufacturing method of the present invention Filling method 1: Direct injection, by applying pressure to the liquid plug, the plug will fill the channel.

Filling method 2: Vacuum filling. The inlet is covered with liquid metal. The 3D printed channels are placed in a vacuum chamber, which removes the air. Releasing the vacuum returns the ambient to atmospheric pressure, which pushes the metal into the channels Materials Any combination or derivative of a combination of the following materials for the multi-material plug flow can be used:

conductive material: The conductive plug material used to fill the channel components which require high conductivities (e.g., inductor components, electrode components of the capacitors) can be filled with eutectic metals, which may or may not be mixed with conductive nanoparticles (e.g., silver, gold). Alternatively, the inner or outer walls of the channels can be selectively plated with a conductive material such as copper. Hot injection of conductive metals (e.g., Ag) can also be utilized.

The disclosed 3D printing method makes use of conductive materials with a higher resistivity than that of copper, lowering the SNR of the coils. However, the larger skin depth of the eutectic metals partially compensates for this adverse effect. Moreover, the disclosed manufacturing method allows for the design of coils to conform to the patient's anatomy, which benefits the SNR as the SNR is inversely proportional to the square of the distance from the center of the coil.

Functionalized liquid/gel/paste/slurries containing high-dielectric (high-k) particles will be used as the high dielectric material for the plug flow. Certain particles such as oxides (e.g., Br/Sr titanates) exhibit very large dielectric constants and are readily dispersible in aqueous or non-aqueous solvents with the help of dispersing agents. This makes them particularly useful for the formulation of high k slurries. The effective dielectric constant of the final slurry can be approximated using effective medium approximations such as the Maxwell-Garnett model.

$$\text{Maxwell–Garnett model: } \varepsilon = \varepsilon_1\left(1 + \frac{3f(\varepsilon_2 - \varepsilon_1)}{2\varepsilon_1 + \varepsilon_2 - f(\varepsilon_2 - \varepsilon_1)}\right)$$

Certain parts of the CAD circuit will contain redundant parts which have no functionality after the two-stage filling method is complete. As these redundant sections can potentially add to undesired noise in the electronic circuit, they can be "blocked" by filling them with a "decoupling plug". This decoupling material has material characteristics similar to that of the SLA resin.

Passing high currents through conductive channels can result in undesired heating. This heating arises from (a) vibrations (friction) of the conductive channels—the Lorentz forces that result from putting electrical current through copper wires immersed in a magnetic field and/or (b) through direct (resistive) electrical mechanisms. The release of thermal energy can result in heat-induced frequency shifts and shim field alterations. Therefore heat must be removed from the 3D printed conductive channels. Alternatively it might be desired to cryo cool the coils as to increase the SNR. This can be done in embodiments of the invention by designing cooling channels around the probe or the addition of a cooling channel inside/outside the main conductive channel of the main inductor of the RLC circuit. A cooling liquid/gas (e.g., water, nitrogen) will be passed through the cooling channel, removing the undesired heat generated by the probe. The cooling channels can be conformally designed around the conductive channels to closely follow the shape or profile of the conductive channels allowing for rapid and efficient heat removal. Similarly, a heating liquid can be passed through the channels to allow for the precise temperature control of the to be scanned object (e.g., subjects under anesthesia need to be kept warm). A schematic overview of MR RF probes (i) with a conformal temperature control channel, (ii) an internal temperature control channel and (iii) an external temperature control channel is depicted in FIG. 8. Any combination of these temperature control channels can be utilized (e.g. internal cryo-cool channel in combination with external heating channel as not to harm the subject). FIG. 8 also depicts the additional channels 500 mentioned above.

Generative modeling will be used to concisely construct the complex 3D channel network necessary for the CAD design. Herein, 3D objects are replaced by object-generating operations. Generative modeling gains efficiency through creating high-level shape operators from low-level shape operators. Any sequence of processing steps can be grouped to create a new combined operator. It may use elementary operators as well as other combined operators. Concrete values can easily be replaced by parameters, which makes it possible to separate data from operations. The same processing sequence can be applied to different input data sets. The same data can be used to produce different shapes by applying different combined operators from, e.g., a library of domain-dependent modeling operators. This approach makes it possible to create very complex objects from only a few high-level input parameters, such as, for instance, a style library [en.wikipedia.org/wiki/Generative_Modelling_Language].

Figure 9:
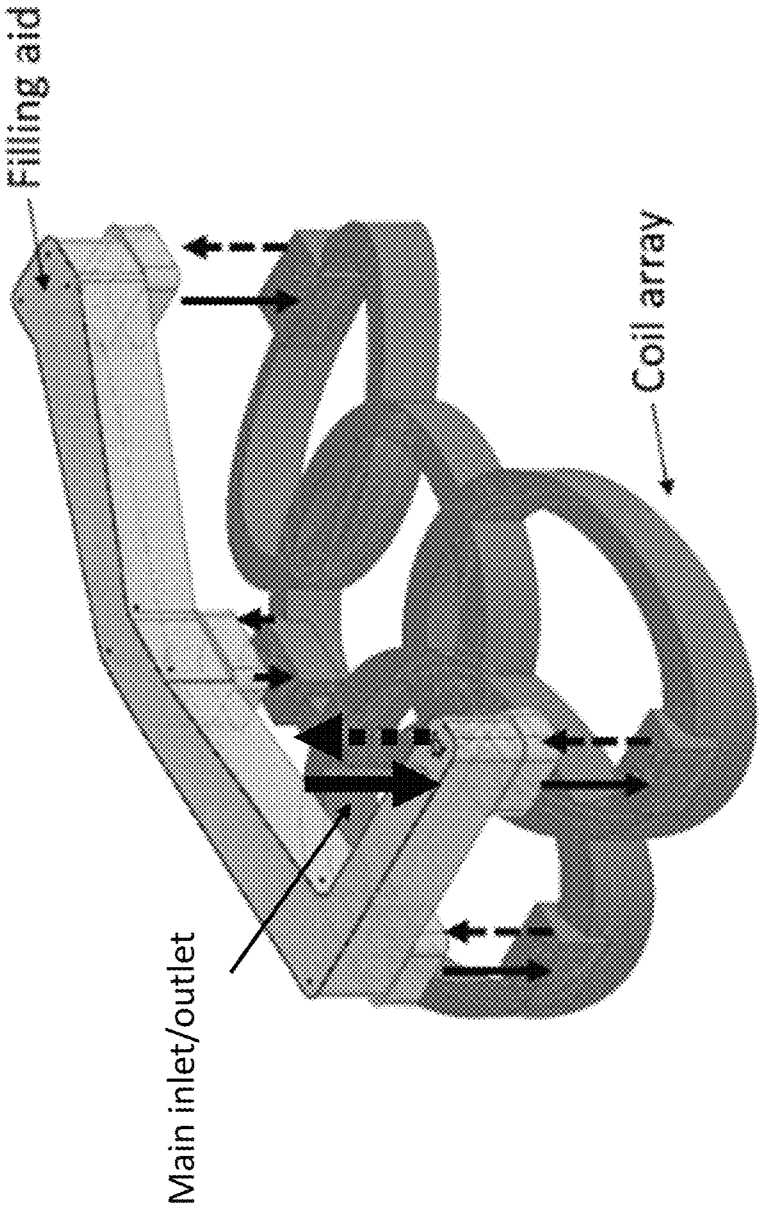

When multiple loops are required for the coil design (e.g., RF receive surface array coil), each loop would have to be filled individually. To increase the time efficiency of filling these complex coil designs, a filling aid is used, see FIG. 9. The filling aid fits over all individual inlets/outlets of the complex coil array (black arrows). This interconnects all the individual channels to the main (single) channel of the filling aid. This reduces the number of inlets/outlets to just one (main inlet/outlet). The filling aid will be removed after filling of the complex coil array is complete.

The invention claimed is:

1. A configuration for MRI or NMR measurements, the configuration comprising one or more 3D-printed hollow elements, adapted to the shape of an object to be measured, wherein one or more of the 3D-printed hollow elements comprises a wall made of a UV-curable electrically non-conducting material forming one or more channels wherein at least one of the one or more channels comprises at least two material plugs of at least two different immiscible materials selected from the group consisting of: a capacitor alternatively filled with a dielectric material and an electrically conductive material, an inductor of an electrically conductive material, and a resistor of a material with high electrical resistance.

2. The configuration according to claim 1, wherein the material plugs form an electric circuit or parts of an electric circuit.

3. The configuration according claim 2, comprising one or more of the electric circuits connected with one or more electronic circuit boards, thereby allowing control of matching, tuning, detuning, and decoupling of the individual elements.

4. The configuration according to claim 1, wherein the 3D-printed hollow elements form loops.

5. The configuration according to claim 1, wherein each of the one or more channels comprises a capacitor alternatively filled with a dielectric material and an electrically conductive material, an inductor of an electrically conductive material, and a resistor of a material with high electrical resistance, which materials are different and immiscible.

6. The configuration according to claim 1, wherein each of the one or more channels comprises a capacitor alternatively filled with a dielectric material and an electrically conductive material; or each of the one or more channels comprises an inductor of an electrically conductive material, and a resistor of a material with high electrical resistance.

7. The configuration according to claim 1, wherein in all of the one or more 3D-printed hollow elements, the wall is made of the UV-curable electrically non-conducting material forming the one or more channels.

8. The configuration according to claim 1, wherein the wall of the 3D-printed hollow element made of the UV curable material forms a single channel.

9. The configuration according to claim 1, adapted to an anatomy of a body or a body part of an animal or human subject.

10. The configuration according to claim 1, wherein the 3D printed hollow elements are manufactured by VAT polymerization or by direct material melt printing.

11. The configuration according to claim 1, wherein the 3D printed hollow elements are flexible.

12. The configuration according to claim 1, further comprising additional channels with a material to control the temperature of the 3D printed hollow elements.

13. A device comprising a configuration according to claim 1, the device configured to transmit RF signals, receive RF signals, or homogenize magnetic fields.

14. A method for producing a configuration according to claim 1, the method comprising:

(a) providing geometrical data of an object to be measured;

(b) defining an external shape of a loop configuration or element thereof to adapt to a shape of the object by electromagnetic simulations and/or design computing and/or generative modeling, resulting in a CAD design of the configuration;

(c) calculating volumes and delivery sequences of the dielectric material, the electrically conductive material with an electrical conductivity above $10^2$ S/m at 20° C., or the material with high electrical resistance to provide at least two material plugs to form an electric circuit or a part of an electric circuit;

(d) 3D printing the loop configuration or element thereof in accordance with calculations from (b) and (c), wherein walls of the loop configuration or element thereof form one or more channels and are made of a UV curable electrically non-conducting material; and (e) filling at least one of the channels or a designated part of at least one of the channels in the loop configuration or element thereof prepared in (d) with the at least two material plugs of at least two different immiscible materials selected from the group consisting of a capacitor alternatively filled with a dielectric material and an electrically conductive material, an inductor of an electrically conductive material, and a resistor of a material with high electrical resistance in accordance with the volumes and delivery sequences calculated in (c).

15. The method according to claim 14, wherein the loop configuration or element thereof is printed as a loop.

16. The method according to claim 15, wherein filling the channel or the designated part of the channel comprises by either filling the channel or the designated part of the channel with a conductive material or electroplating either an inner wall or an outer wall of a designated part of the loop configuration or element thereof with a conductive layer.

17. The method according to claim 15, further comprising manufacturing capacitive components of an equivalent RLC circuit by manipulating length, shape, and sequence of the material plugs inside a section of the channel designated to the capacitive components.

18. The method according to claim 17, wherein manufacturing the capacitive components comprises:

filling the channel with the electrically conductive material and the high-dielectric fluid; and connecting the loop configuration or element thereof in such a way that the channels of different elements or loops form multiple capacitors in parallel.

19. The method according to claim 15, further comprising manufacturing inductive components of an equivalent RLC circuit by manipulating length, shape, and sequence of the material plugs inside a section of the channel designated to the inductive components.

20. The method according to claim 15, further comprising manufacturing resistive components of an equivalent RLC circuit by manipulating length, shape, and sequence of the material plugs inside a section of the channel designated to the resistive components.

21. The method according to claim 15, further comprising designing with electromagnetic simulation software an electronic circuit that meets performance requirements based on experimental requirements.

22. The method according to claim 15, wherein the configuration comprises a plurality of connected loop configurations or elements thereof, and wherein a plurality of channels are filled with a single sequence of the material plugs.

* * * * *